(12) United States Patent
Nemanick et al.

(10) Patent No.: US 12,327,650 B2
(45) Date of Patent: Jun. 10, 2025

(54) SCALABLE RADIOISOTOPE POWER TILES

(71) Applicant: The Aerospace Corporation, El Segundo, CA (US)

(72) Inventors: Eric Joseph Nemanick, Santa Monica, CA (US); Henry Helvajian, Pasadena, CA (US); Adon Delgado, Jr., West Hills, CA (US); Kristine L. Ferrone, Pasadena, TX (US)

(73) Assignee: THE AEROSPACE CORPORATION, El Segundo, CA (US)

( * ) Notice: Subject to any disclaimer, the term of this patent is extended or adjusted under 35 U.S.C. 154(b) by 356 days.

(21) Appl. No.: 17/864,864

(22) Filed: Jul. 14, 2022

(65) Prior Publication Data

US 2024/0021336 A1 Jan. 18, 2024

(51) Int. Cl.
*G21H 1/10* (2006.01)

(52) U.S. Cl.
CPC .................. *G21H 1/103* (2013.01)

(58) Field of Classification Search
CPC ..................................... G21H 1/103
See application file for complete search history.

(56) References Cited

U.S. PATENT DOCUMENTS

| | | | |
|---|---|---|---|
| 2,900,535 A | 8/1959 | Alexander | |
| 3,321,646 A | 5/1967 | Grover et al. | |
| 3,510,362 A * | 5/1970 | Charland | H10N 10/813<br>136/202 |
| 3,561,224 A * | 2/1971 | Banks | G05D 23/1919<br>136/203 |
| 3,668,015 A * | 6/1972 | Streb | G21H 1/10<br>136/202 |
| 3,728,160 A * | 4/1973 | DesChamps | G21H 1/103<br>136/202 |
| 3,857,738 A | 12/1974 | Brown | |
| 5,610,366 A * | 3/1997 | Fleurial | H10N 10/853<br>136/202 |

(Continued)

FOREIGN PATENT DOCUMENTS

| | | |
|---|---|---|
| CN | 106876617 A | 6/2017 |
| FR | 2941095 B1 | 4/2011 |
| WO | 2012094674 A3 | 10/2012 |

OTHER PUBLICATIONS

Stivers (Year: 1964).*
Kaity V Chandler, "Notice of Allowance", issued Dec. 1, 2021, U.S. Appl. No. 16/654,105.

*Primary Examiner* — Sadie White
(74) *Attorney, Agent, or Firm* — LeonardPatel PC

(57) ABSTRACT

Scalable radioisotope power tiles that can provide heat, electrical power, or both, are disclosed. Unlike conventional radioisotope thermoelectric generator (RTG) designs, the scalable radioisotope power tiles do not necessarily seek to minimize the RTG surface area. Rather, a planar design may be used to maximize the radiative surface to increase the temperature difference ($\Delta T$) and increase system heat to electricity conversion efficiency where electrical power generation is desired. In addition, such a planar design can be one-sided or two-sided, allowing for flexibility in design. For instance, such power tiles may be deployed in a material like a solar sail, on the surface of a vehicle, in terrestrial systems, etc.

35 Claims, 13 Drawing Sheets

(56) References Cited

U.S. PATENT DOCUMENTS

| | | | |
|---|---|---|---|
| 2002/0014261 A1* | 2/2002 | Caillat | H10N 10/853 |
| | | | 136/205 |
| 2011/0226302 A1* | 9/2011 | Farmer | H10N 10/82 |
| | | | 136/200 |
| 2011/0233990 A1* | 9/2011 | Boncodin | B60L 50/90 |
| | | | 301/6.1 |
| 2013/0084474 A1 | 4/2013 | Mills | |
| 2013/0278109 A1* | 10/2013 | Zafiropoulo | G21H 1/02 |
| | | | 310/303 |
| 2018/0108956 A1 | 4/2018 | Fortenbacher | |
| 2019/0115162 A1 | 4/2019 | Goodenough et al. | |
| 2021/0119283 A1 | 4/2021 | Nemanick et al. | |

\* cited by examiner

SCALABLE RADIOISOTOPE POWER TILES

FIELD

The present invention generally pertains to heat and power generation, and more particularly, to scalable radioisotope power tiles that can provide heat, electrical power, or both.

BACKGROUND

Currently, the state-of-the-art of radioisotope thermoelectric generators (RTGs) used for space missions is the multi-mission RTG (MMRTG) designed and utilized by NASA. This rather massive design has been used for both deep space missions and Mars missions. The MMRTG is a stacked cylinder of radioisotopes surrounded by protective metals and a carbon aeroshell, and then thermoelectrics and multiple radiator fins. However, this relatively large design limits the MMRTG to only the largest missions.

While NASA aims to build multiple smaller vehicles for solar system missions, the MMRTG design and similar designs, such as the GPHS-RTG (General Purpose Heat Source RTG) and MHW_RTG (Multihundred-Watt RTG) are too large for such smaller vehicles. Also, the relatively large, cylindrical MMRTG design cannot be made smaller without substantially reducing its already middling power density. Also, the design precludes addition of multiple MMRTG units to generate a desired power output due to overlapping radiative zones. Thus, there would need to be multiple designs for each spacecraft size and desired power output, vastly increasing the development and qualification costs. In addition, the monolithic design prevents missions where sensors or daughter craft can be deployed that are powered by individual small RTGs without designing, developing, and qualifying multiple new designs, leaving the mothership with most of its power intact. Accordingly, an improved and/or alternative solution for providing thermoelectric power and/or heat via radioisotopes may be beneficial.

SUMMARY

Certain embodiments of the present invention may be implemented and provide solutions to the problems and needs in the art that have not yet been fully solved by existing heat and power generation systems. For example, some embodiments pertain to scalable radioisotope power tiles that can provide heat, electrical power, or both.

In an embodiment, a radioisotope power tile includes a tile body and one or more radioisotope power units located within the tile body. The radioisotope power tile also includes one or more radiator surfaces operably connected to the tile body and at least one of the one or more radioisotope power units.

In another embodiment, a radioisotope power tile includes one or more radioisotope power units. The radioisotope power tile also includes one or more radiator surfaces operably connected to at least one of the one or more radioisotope power units.

In yet another embodiment, a radioisotope power tile includes a tile body and one or more radioisotope power units located within the tile body. The radioisotope power tile also includes one or more radiator surfaces operably connected to the tile body and at least one of the one or more radioisotope power units. The one or more radioisotope power units include a radioisotope unit including one or more radioisotopes, one or more hot shoes operably connected to the radioisotope unit, one or more cold shoes, and a plurality of thermal junctions operably connecting the one or more hot shoes to the one or more cold shoes. The one or more cold shoes are each thermally connected to a radiator surface of the one or more radiator surfaces.

BRIEF DESCRIPTION OF THE DRAWINGS

In order that the advantages of certain embodiments of the invention will be readily understood, a more particular description of the invention briefly described above will be rendered by reference to specific embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

Unless otherwise indicated, similar reference characters denote corresponding features consistently throughout the attached drawings.

DETAILED DESCRIPTION OF THE EMBODIMENTS

Some embodiments of the present invention pertain to single-sided radiator scalable radioisotope power tiles that can provide heat, electrical power, or both. Unlike conventional RTG designs, some embodiments use multiple small isotope pellets within the scalable radioisotope power tile. The power tiles may include thermoelectrics to generate electrical power or may be used for heat generation only, depending on the application. Rather than combining the isotopes into one large, very hot radioisotope unit for heat generation, the scalable radioisotope power tile of some embodiments instead uses multiple or many smaller radioisotope units to create heat in multiple or many locations within the scalable radioisotope power tile to have a lower temperature at the surface of the radioisotope power units. As used herein, "scalable" refers to the ability to include a desired number of power tiles for a given vehicle, as well as ability to include a desired number of radioisotope power units in the power tiles. The scalable power tiles may be identical in some embodiments. In other embodiments, multiple power tile designs may be used for a vehicle. For instance, the size of the power tile, the number and/or size of the radioisotope power units of the power tile, or both, may be designed based on component needs proximate to where the power tiles are to be located.

Figure 1:
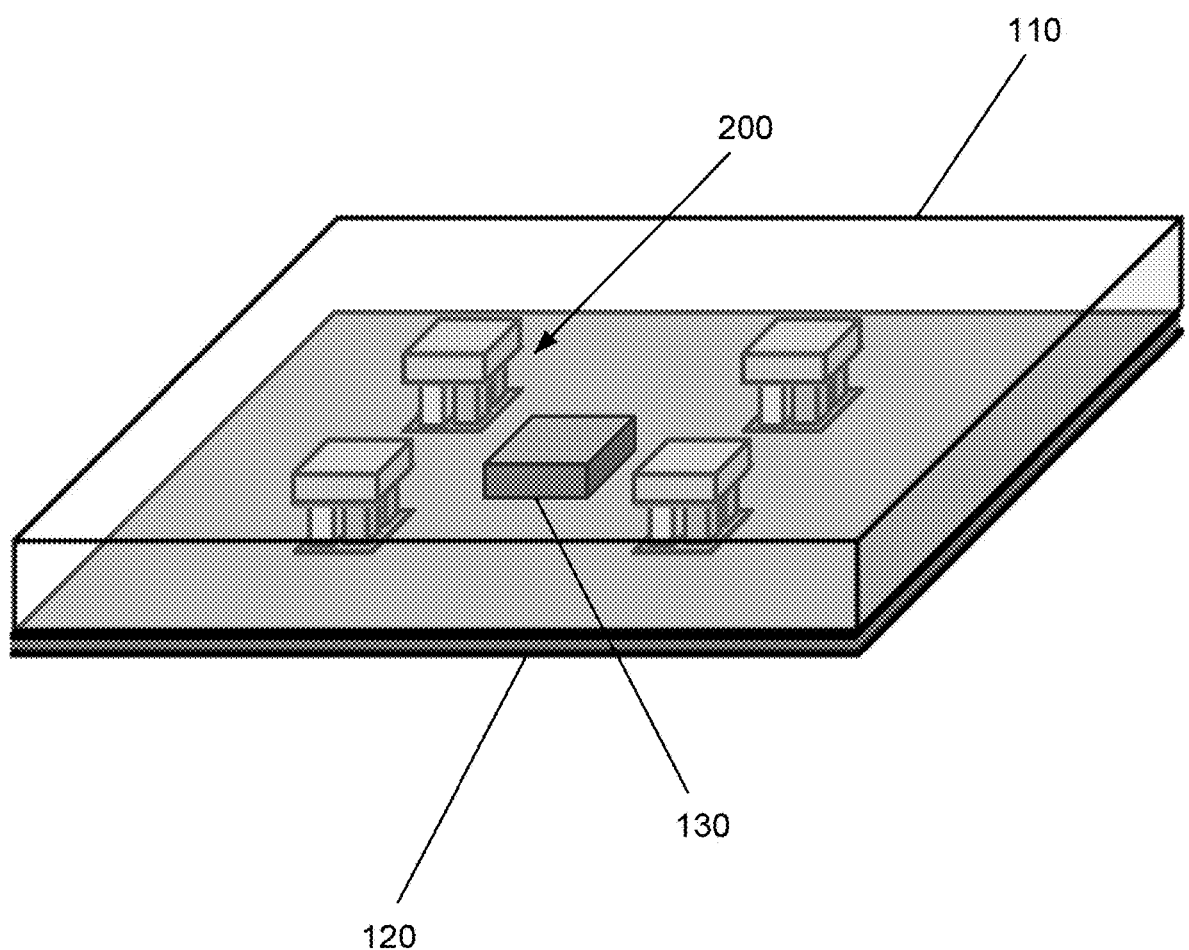
FIG. 1 is a perspective view illustrating a scalable radioisotope power tile with radioisotope sources and their thermoelectrics connected to a single radiator surface, according to an embodiment of the present invention.

FIG. 1 is a perspective view illustrating a scalable radioisotope power tile 100 with radioisotope power units 200 and their thermoelectrics connected to a single radiator surface 120, according to an embodiment of the present invention. Distribution of the radioisotope into multiple units lowers the local temperature and allows more types of thermoelectric devices to be used, such as skutterudites ($CoSb_3$, $LaFe_4Sb_{12}$, $Fe_3CoSb_{12}$, and others), $CsBi_4Te_6$, $BiosSbi_5Te_3$, and others, which can be more efficient, but also make more materials thermally compatible in scalable radioisotope power tile 100. Radioisotope power tile 100 may also include one or more other components (e.g., electronics, power regulation components, sensors, and/or other critical system components) within a tile body 110, such as electronic or mechanical component 130. Tile body 110 can also be filled with thermally insulating materials in some embodiments, such as multilayer insulation (MLI), aerogels, polymer or ceramic foams, or other insulation material to keep the heat flowing through the thermoelectric junctions.

In conventional RTG designs, a common failure mechanism is the thermal decomposition of the thermoelectrics, connecting materials, and insulation from the high heat generated in large RTGs (e.g., over 800° C.). By distributing the radioisotopes within scalable radioisotope power tile 100, lower temperatures are achieved, and multiple thermoelectric junctions are used. For instance, such power tiles could be designed to provide surface temperatures of 20° C., 50° C., 100° C., etc. These temperatures are compatible with existing space vehicle components.

Figure 2:
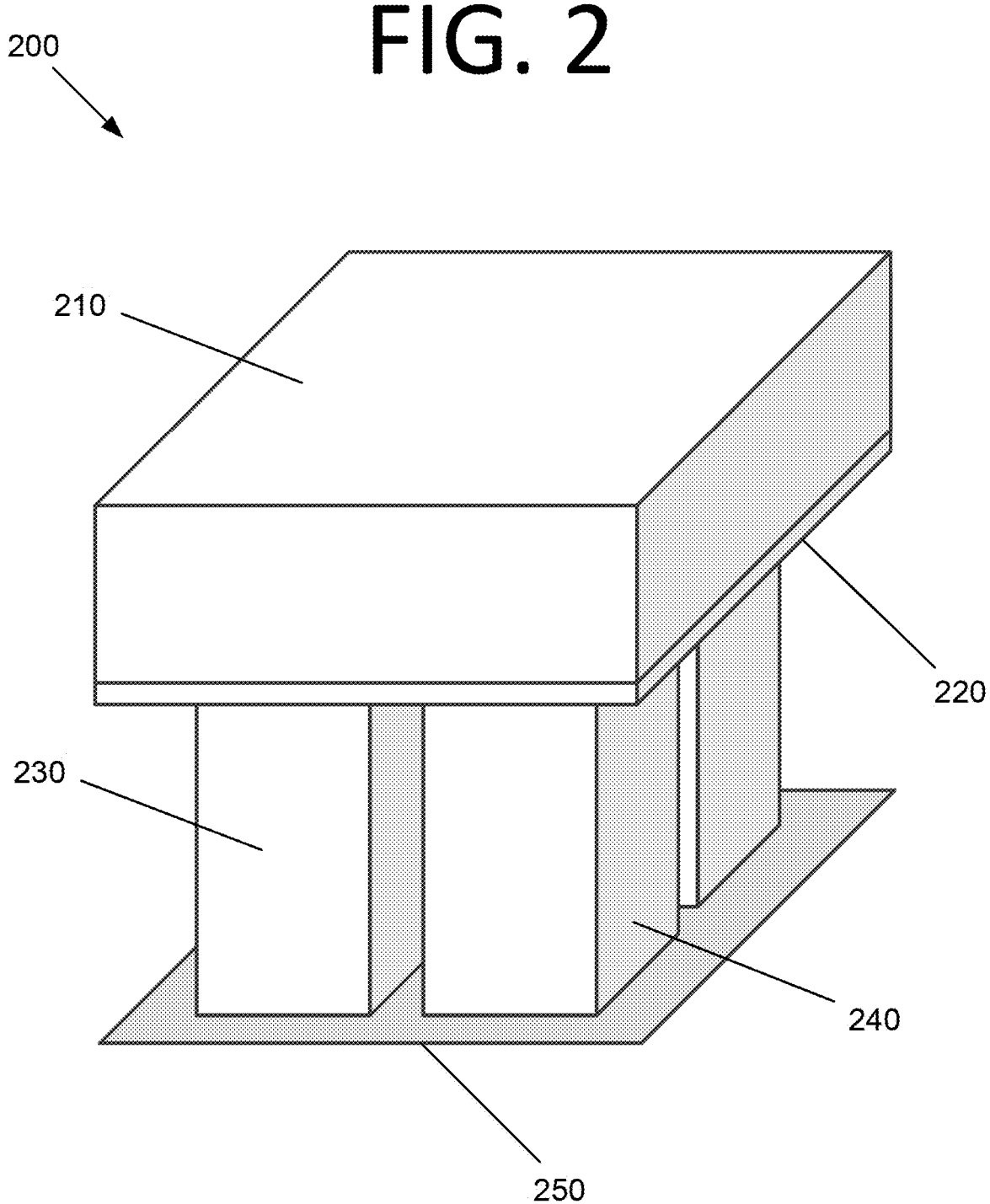
FIG. 2 is a perspective view illustrating a radioisotope power unit, according to an embodiment of the present invention.

In scalable radioisotope power tile 100, there are four radioisotope power units 200 within tile body 110. However, any desired number of radioisotope power units may be used without deviating from the scope of the invention. Referring to FIG. 2, each radioisotope power unit 200 includes a radioisotope unit 210. Radioisotope unit 210 may include compounds of isotopes of $^{238}Pu$, $^{90}Sr$, $^{241}Am$, and/or any other unstable radio isotopes that undergo decay generating radiation and heat. Radioisotope unit 210 may be clad in metals such as Pt, Pd, Os, W, and/or any other shielding materials to capture the radiation and convert it to heat. Attached to radioisotope unit 210 are thermoelectric junctions 230, 240, a bridging hot shoe 220 and a cold shoe 250. Thermoelectric junctions 230, 240 may be n-type and p-type, and may generate electrical energy through the dissimilar temperatures between hot shoe 220 and cold shoe 250.

Returning to FIG. 1, radiator surface 120 is thermally connected to hot shoes 250 of radioisotope power units 200. Radiator surface 120 emits thermal energy to a cold sink (not shown). This cold sink can be the background of the universe or another heat sink, such as a cold component of the vehicle that scalable radioisotope power tile 100 is powering.

Figure 3:
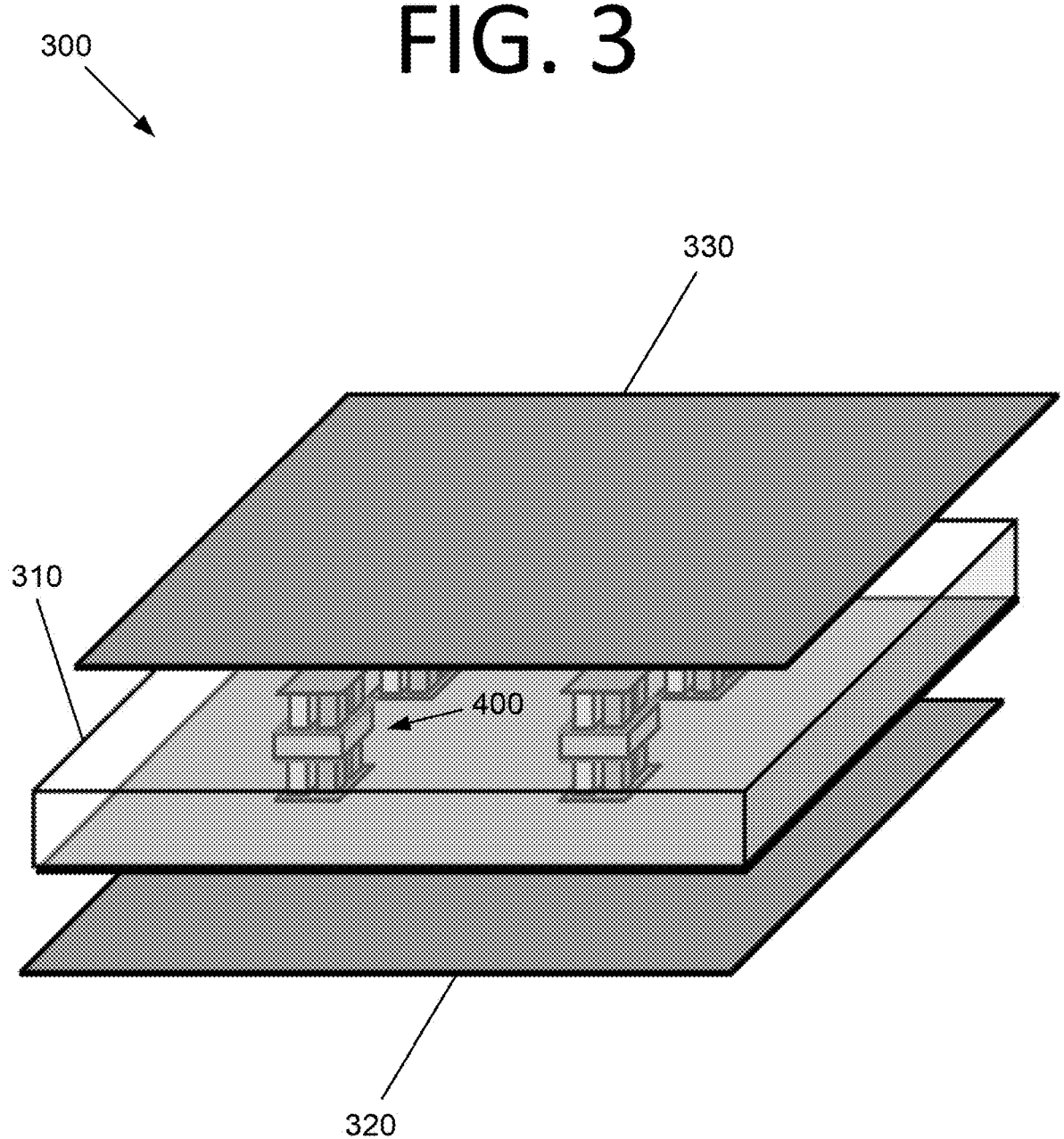
FIG. 3 is a partially exploded perspective view illustrating a scalable radioisotope power tile with radioisotope power units and their thermoelectrics connected to two radiator surfaces, according to an embodiment of the present invention.
Figure 4:
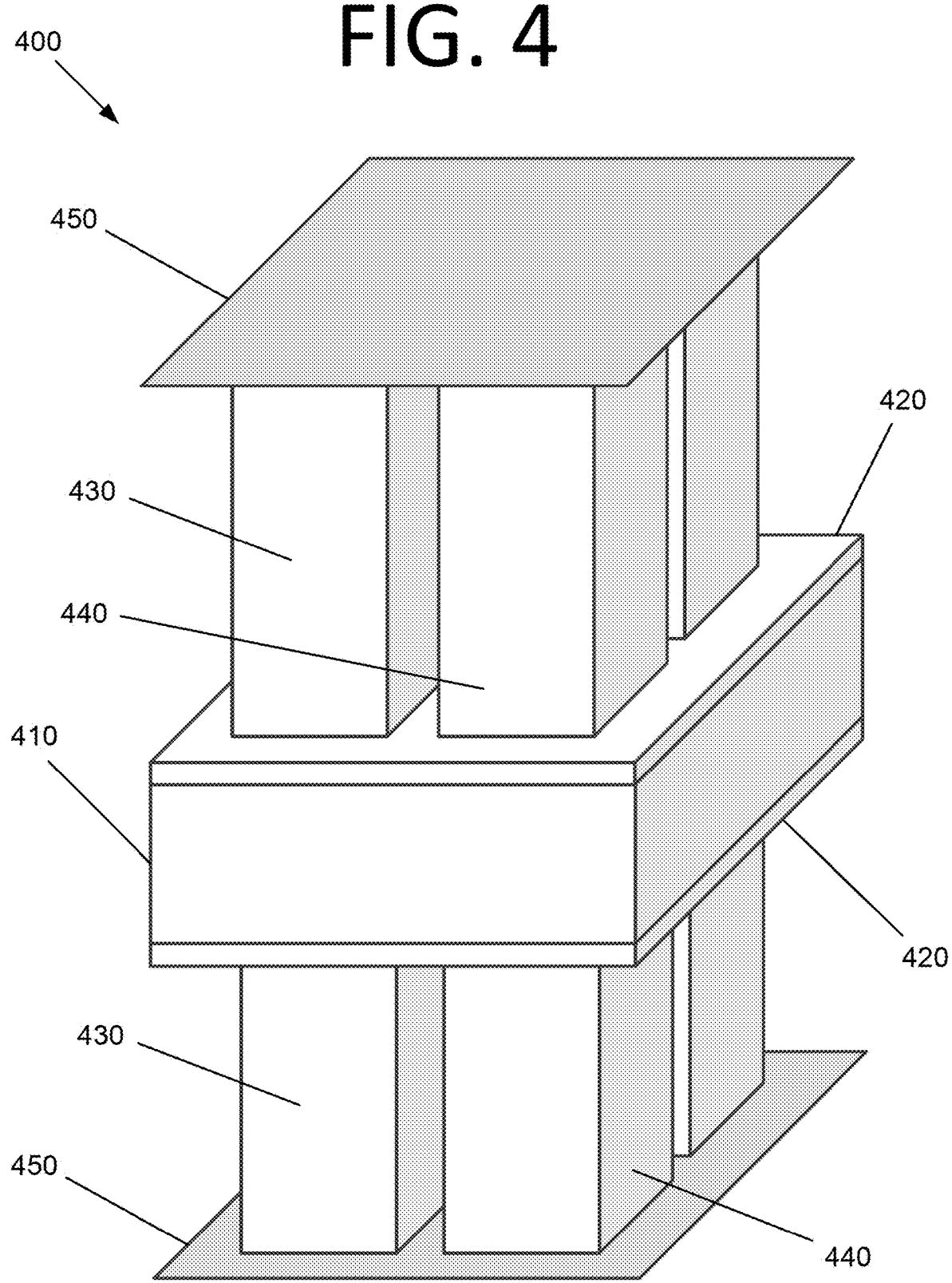
FIG. 4 is a perspective view illustrating a radioisotope power unit, according to an embodiment of the present invention.

Some embodiments of the present invention pertain to double-sided scalable radioisotope power tiles. FIG. 3 is a partially exploded perspective view illustrating a scalable radioisotope power tile 300 with radioisotope power units 400 and their thermoelectrics connected to two radiator surfaces 320, 330, according to an embodiment of the present invention. Radiator surfaces 320, 330 are located on opposite sides of a tile body 310. Radioisotope power unit 400 has hot shoes 420 on both sides of radioisotope unit 410. Extending outwards from hot shoes 420 are thermoelectric junctions 430, 440, which are connected to respective cold shoes 450, which in turn are in thermal communication with respective radiator surfaces 320, 330. This design allows for thermal radiation in multiple directions, which may make better use of the space on the vehicle to be powered by scalable radioisotope power tile 300.

Unlike conventional RTG designs, the scalable radioisotope power tiles of some embodiments do not necessarily seek to minimize the RTG surface area. Rather, such embodiments may use a planar design to maximize the radiative surface to increase the temperature difference (ΔT), which is the difference in temperature between the thermoelectric hot and cold shoes, and increase system heat to electricity conversion efficiency. In addition, such a planar design can be one-sided or two-sided, allowing for flexibility in design. For instance, such power tiles may be deployed in a material like a solar sail, on the surface of a vehicle, on booms extending from the vehicle, etc.

Figure 5A:
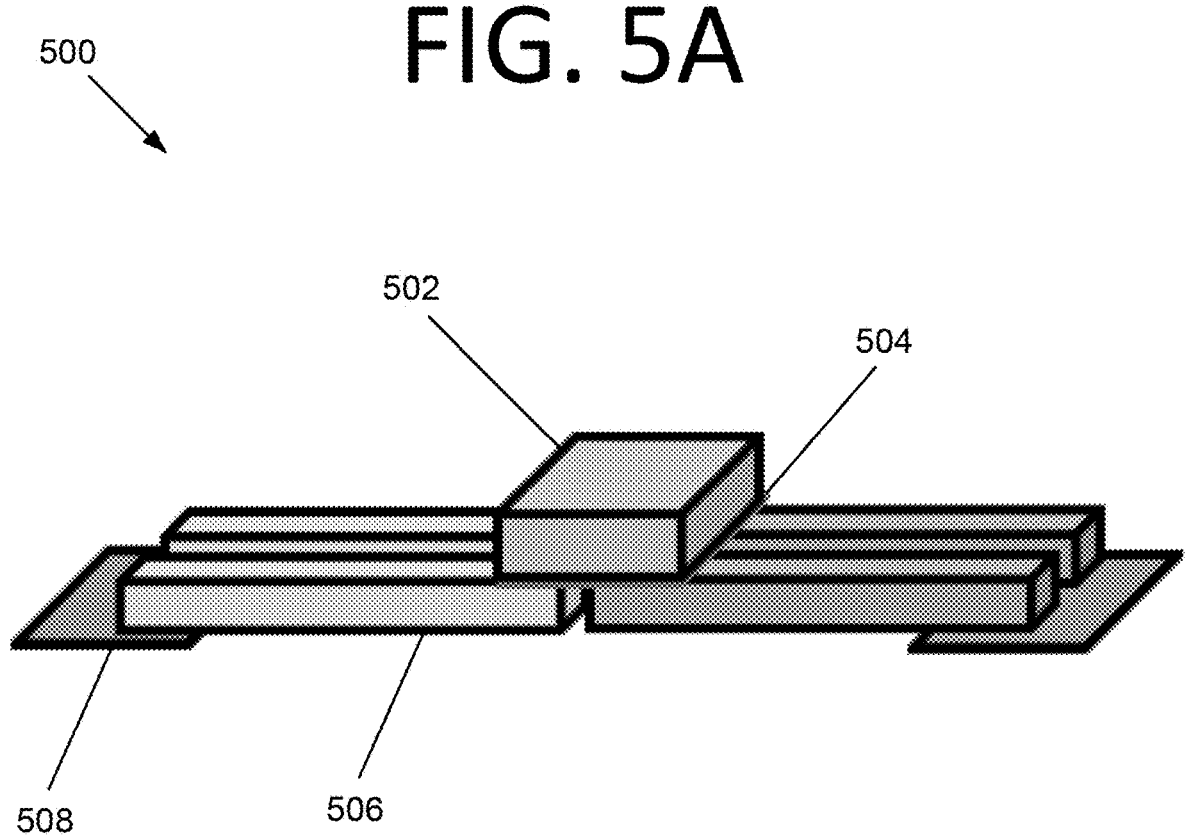
FIG. 5A is a perspective view illustrating a scalable radioisotope power tile with a single-sided design, according to an embodiment of the present invention.
Figure 5B:
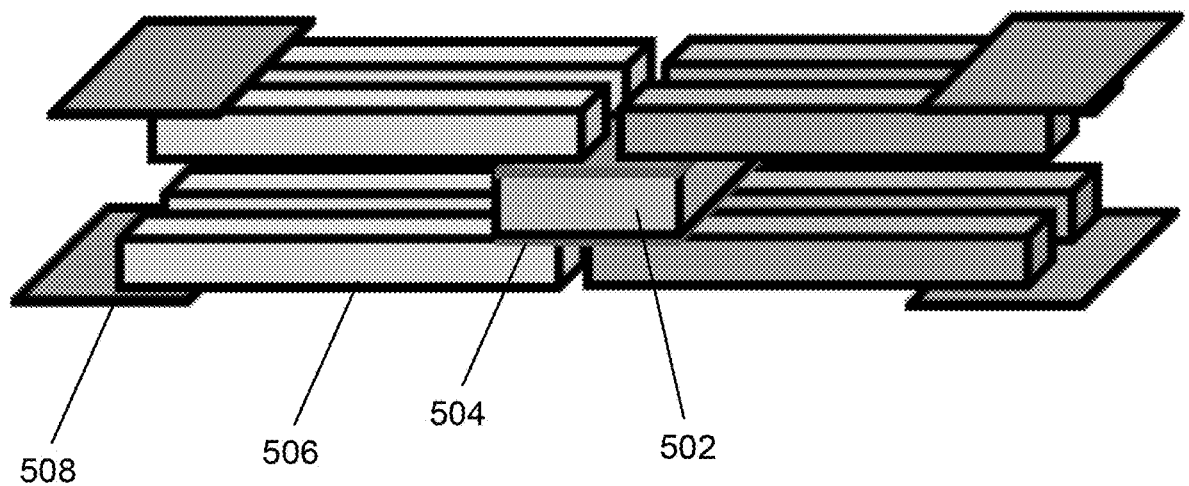
FIG. 5B is a perspective view illustrating a scalable radioisotope power tile with a double-sided design, according to an embodiment of the present invention.
Figure 5C:
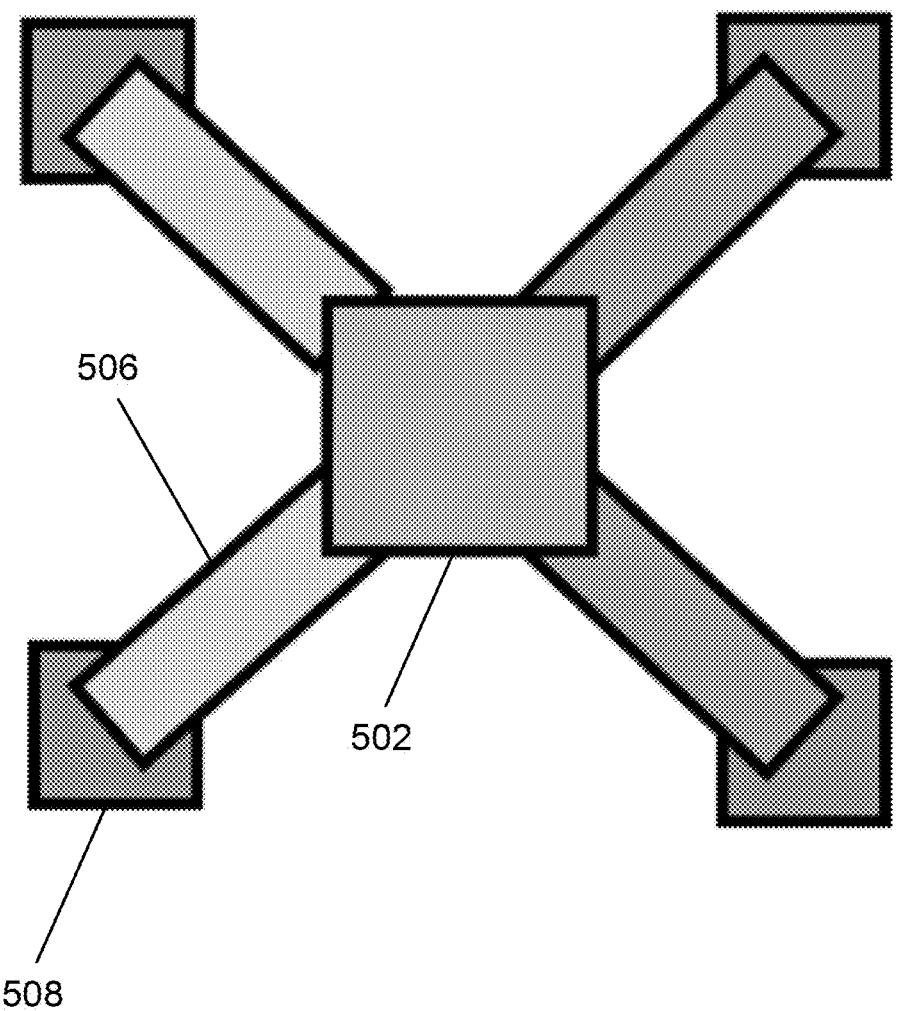
FIGS. 5C and 5D are a perspective views illustrating scalable radioisotope power tiles with thermoelectrics in the plane of the scalable radioisotope power tiles and arranged perpendicularly to one another, according to an embodiment of the present invention.
Figure 5D:
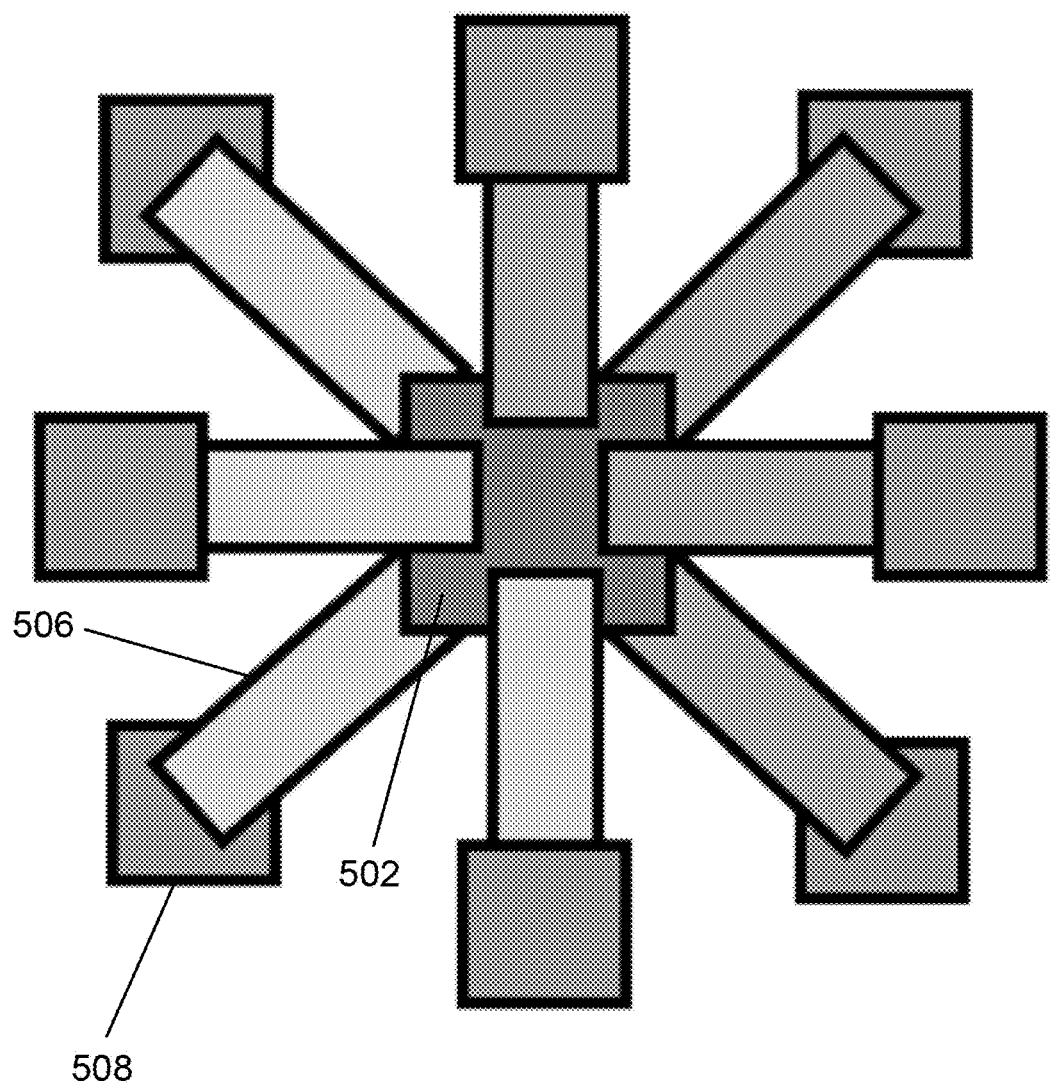

The power tile of some embodiments has a unit of radioisotope with the thermoelectric junctions laid out in the plane of the tile. In addition to extending the thermoelectric junctions perpendicularly from the radioisotope as in FIGS. 1-4, the thermoelectrics can be in other geometries in the plane of the tile in some embodiments. For instance, scalable radioisotope power tile 500 of FIG. 5A has a radioisotope power unit 502, a hot shoe 504, thermoelectrics 506, and cold shoes 508 in a single-sided design, whereas scalable radioisotope power tile 510 of FIG. 5B has radioisotope power unit 502, hot shoes 504, thermoelectrics 506, and cold shoes 508 in a double-sided design. FIGS. 5C and 5D show scalable radioisotope power tiles 520, 530 with thermoelectrics 506 in the plane of scalable radioisotope power tiles 520, 530 and arranged perpendicularly to one another. Scalable radioisotope power tile 520 has four cold shoes 508, whereas scalable radioisotope power tile 530 has eight cold shoes 508.

The bulk of the tile other than the radioisotope and the thermoelectric materials (i.e., tile body 110, 310) may be constructed from lightweight insulators, aerogel, and/or MLI to keep the heat flowing from the hot to cold shoes without significant energy loss. Tile body 110, 310 may also contain other materials and/or components, such as electronics, power regulation components, sensors, and/or other critical system components. These components may share in the heat from the radioisotope or be insulated from this heat through the insulation of tile body 110, 310.

Some embodiments enable a wide variety of deep space missions, such as solar sail-powered long-distance missions and mothership-daughter vehicle designs, where single tiles powering sensors can power dropped off at points of scientific interest. In addition, the improved power density (e.g., in watts per gram (W/g)) of some embodiments over an MMRTG enables lightweight, high velocity missions to quickly traverse the solar system to their destination.

Developing a thermal model of the tile that incorporates the thermal transport through the thermoelectrics and minimizes the heat lost through tile material other than through the thermoelectric material (TEM)-radiator path may be beneficial to design practical systems. In addition, the thermoelectrics may be fabricated in the plane of the tile to enable to high surface area radiator. This facilitates scalability and higher efficiency.

The thin, compact design of some embodiments allows for scaling the power supply to the vehicle by the number of tiles deployed. The tiles may also be placed in the vehicle design for optimal thermal radiation.

Per the above, some embodiments may be used to power space vehicles and/or components thereof, such as circuit board radiators, spectrometer radiators, antennas, etc. However, it should be noted that embodiments are not limited to space applications. Applications underground, underwater, within buildings, within terrestrial vehicles, etc. are envisioned. For instance, long-term sensors for such applications may be powered by the radioisotope power tiles of some embodiments.

Figure 6:
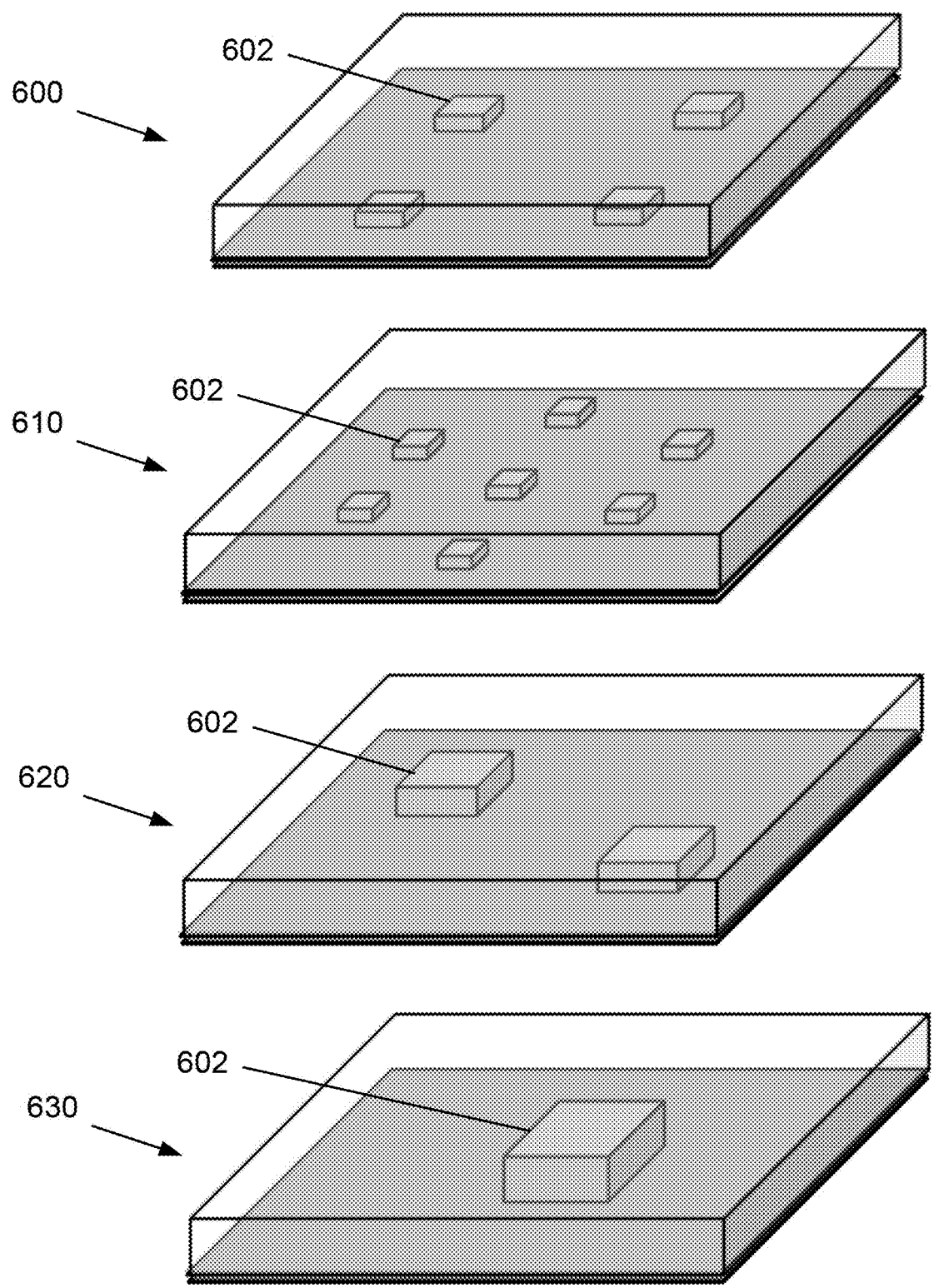
FIG. 6 illustrates perspective views of radioisotope power tiles with various radioisotope unit configurations, according to an embodiment of the present invention.

Some embodiments may spread heat generation out within a device of a vehicle and/or over the vehicle itself. The distribution of the heat source within the device and/or across the vehicle allows the designer to tailor the heat flow and temperature within the device and/or vehicle. FIG. 6 shows some examples of how the isotopic heat sources (radioisotope units 602) can be arranged within a radioisotope power tile for a given amount of radioisotope. Radioisotope power tile 600 shows a square packed arrangement, radioisotope power tile 610 shows a hexagonally packed arrangement, radioisotope power tile 620 shows a diagonal arrangement, and radioisotope power tile 630 shows a single placement of radioisotope unit 602. Since the local temperature at the surface of radioisotope units 602 is defined by the mass of the radioisotopes relative to the surface area of the given face of radioisotope unit 602, the temperature of the radioisotope unit(s) 602 can be tailored for material and thermoelectric compatibility. Unlike large, monolithic isotope sections, where the surface temperature is very high, segmented units of radioisotopes can enable lower temperature thermoelectrics and low temperature insulation, as well as reduce thermal degradation of the device.

Also, using smaller units (i.e., power tiles) spread across the vehicle provides a better temperature profile for the vehicle and its components, allowing for direct usage of the heat being generated by the radioisotope heat sources. Large RTGs may have undesirable temperature characteristics. For instance, temperatures of 900° C. or more that may be generated by such radioisotope systems are generally not compatible with other components and would destroy them. For conventional usage, large RTGs are mounted on long booms to keep the heat source away from the delicate vehicle components. However, if RTGs are modular power tiles distributed over the vehicle, these power tiles may serve as both power generators and heaters.

Figure 7:
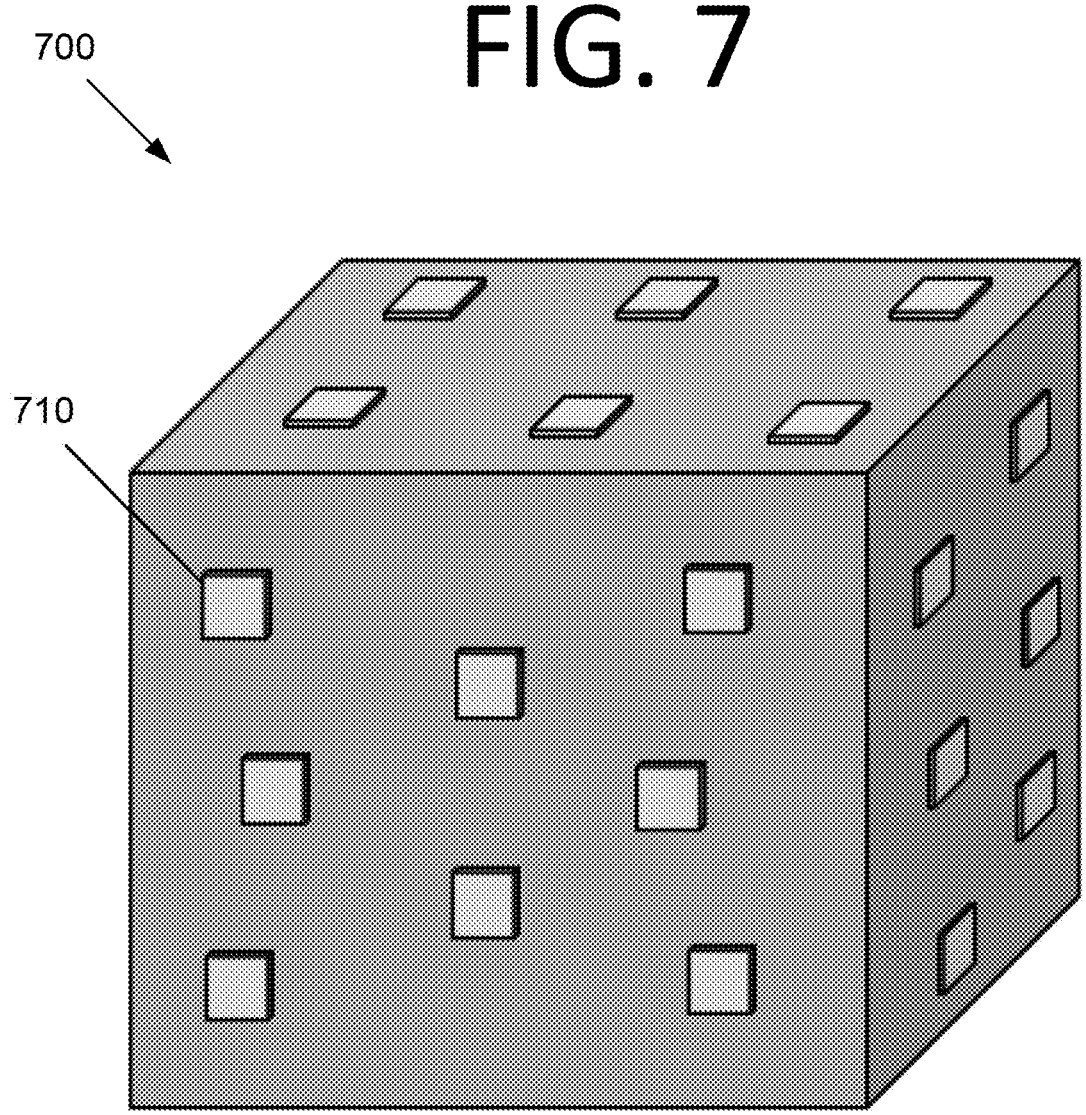
FIG. 7 is a perspective view illustrating a vehicle with modular power tiles acting as heat sources, according to an embodiment of the present invention.

FIG. 7 shows an example of distribution of modular radioisotope power tiles 710 acting as heat sources over a vehicle 700. Power tiles 710 may include thermoelectrics or may be used for heating purposes only in some embodiments (i.e., thermoelectrics may not be included). Multiple radioisotope power tiles 710 located over the surfaces of vehicle 700 to uniformly heat vehicle 700 using the heat generated from the radioisotope heat sources located within radioisotope power tiles 710. This utilization of the heat to be radiated from the radioisotopes into vehicle 700 can displace inefficient resistive heaters in vehicle 700, removing the mass of the heaters and their electrical load from vehicle 700. This design allows for heating, and potentially also electrical power generation, to be performed efficiently, while displacing other components such as extra electrical bus harnessing, heaters, and other components.

Figure 8:
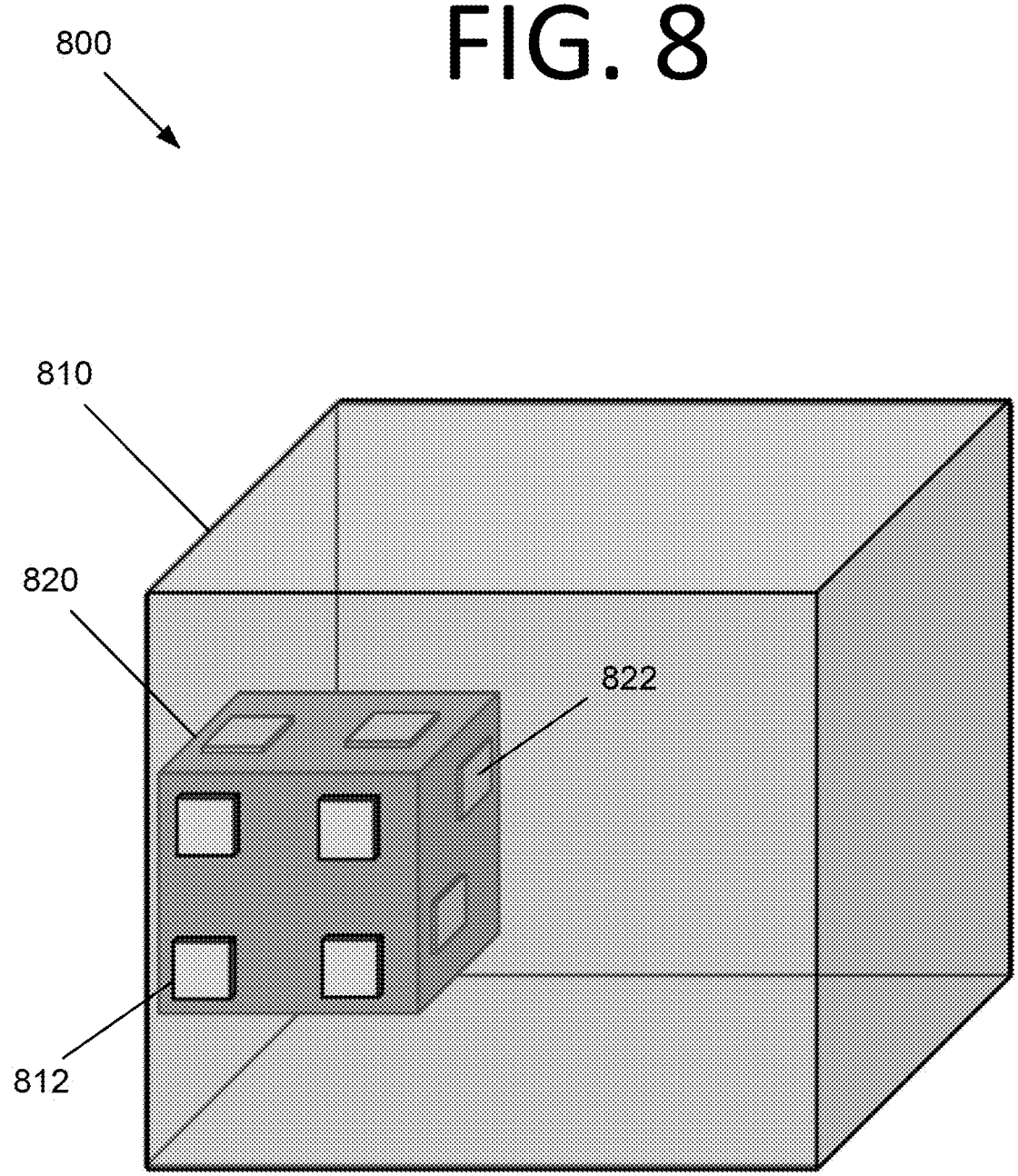
FIG. 8 is a perspective view of a space vehicle with an internal component heated by radioisotope power tiles, according to an embodiment of the present invention.

This distribution of heat can also be done specifically to heat only certain components or portions of the vehicle, as shown in FIG. 8. Vehicle 800 has an enclosure 810 that contains a particular component 820 that requires heating. Radioisotope power tiles 812 are placed on the surface of enclosure 810 where component 820 is located to provide heat, but are also mounted on the surface of component 820 (i.e., radioisotope power tiles 822) internal to enclosure 810 in vehicle 800 to provide heat to component 820. This aspect of modularizing the waste heat from the electrical power generation can be used to locally heat components, obviating the use of long or large heat pipes used with massive, monolithic RTGs, or for the need for local resistive heaters to provide heat for components. Radioisotope power tiles 812, 822 may produce heat only or may include thermoelectrics if generation of electrical power is desired.

In some embodiments, power tiles are distributed in the desired location(s) of the vehicle to locally generate the desired amount of electrical power and heat that is desired. Such local power distribution may also provide power harnessing benefits such as less resistance for power transmission from the power tile to the local powered component(s) and the ability to implement a distributed bus system. In some embodiments, components of the vehicle, such as sensors, detectors, motors, electronics, etc., can be provided with power and heat without central distribution of that power and/or heat from the main vehicle, resulting in a lower mass, more efficient vehicle.

Figure 9:
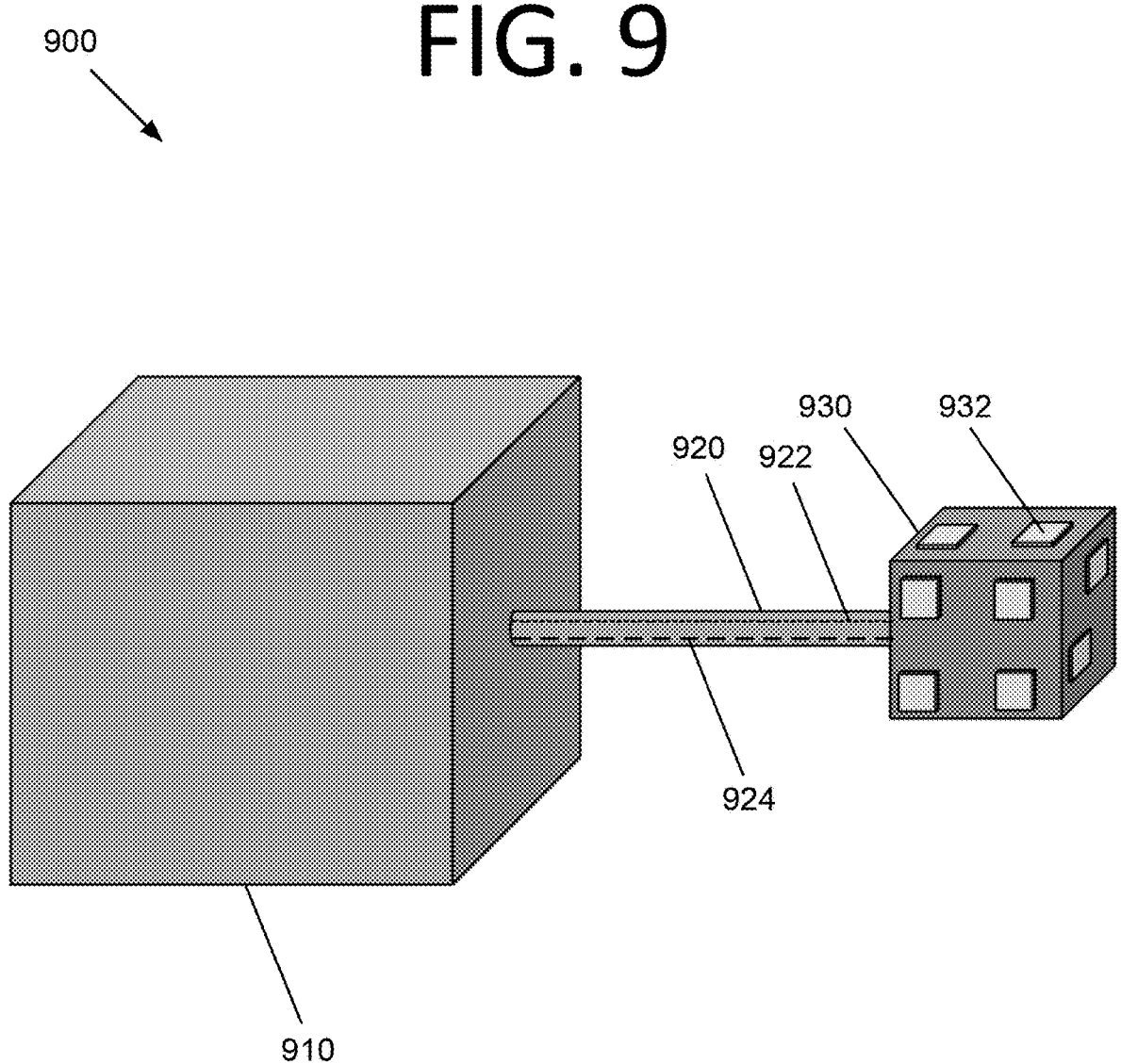
FIG. 9 is a perspective view of a space vehicle with a physically connected external component heated and powered by radioisotope power tiles, according to an embodiment of the present invention.

FIG. 9 shows an example of a vehicle that includes a vehicle component 930 that is well-separated from the main vehicle enclosure 910 by a boom or extension 920. Component 930 may still require heat and/or power from vehicle 900 in some embodiments. By placing radioisotope power tiles 932 on component 930, component 930 can be heated by the waste heat from the power generation from within enclosure 910 via a thermal conduit 922 that thermally connects enclosure 910 and component 930 within boom or extension 920. Component 930 may receive electrical power from and/or transmit electrical power to component 930 via a bus 924 of boom or extension 920. Component 930 is also heated and/or powered locally by radioisotope power tiles 932. However, in certain embodiments, there is no power or heat provided from enclosure 910 via boom or extension 920 to component 930. This removes the need for the power source of the main portion of vehicle 900 (e.g., within main enclosure 910) to be connected to component 930 though wires and harnessing, which could cause both an increase in vehicle mass and power losses from the relatively long distance to distribute electrical power from the main vehicle bus to extended component 930.

Per the above, in some embodiments, excess power generated by power tile(s) could be transmitted from component 930 to other components of vehicle 900 via bus 924. While such power transmission may suffer a power loss over bus 924 (e.g., a 20% loss for relatively distant components), more power is provided for the system as a whole. This distributed power system may both provide low resistance local power to the proximate component(s) and also provide a boost to overall system power that can be distributed among other components as needed or desired. This type of system may be needed for cases where the extended component may need large amounts of power occasionally, but can then distribute excess power back to the main bus when not needed for that component.

Figure 10:
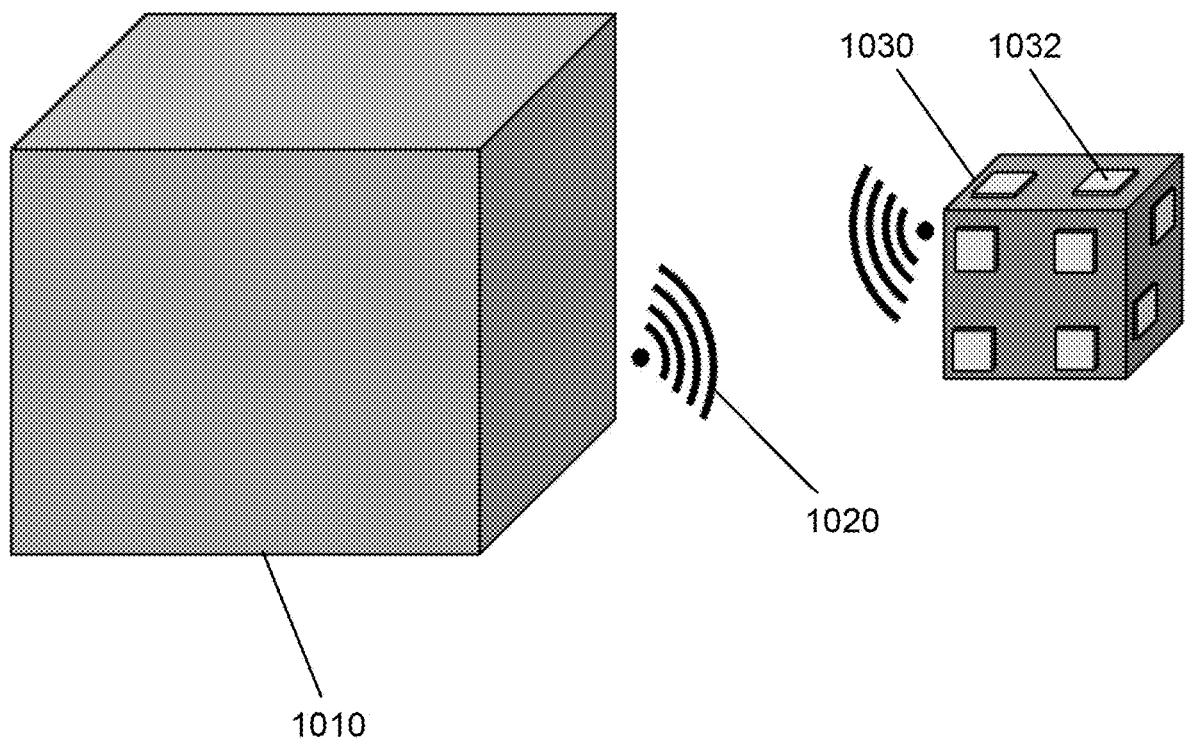
FIG. 10 is a perspective view of a space vehicle with an unconnected external component heated and powered by radioisotope power tiles, according to an embodiment of the present invention.

In some embodiments, a structural component linking the main bus to an extended component, such as boom or extension 920 of FIG. 9, may not be needed. With power and heat being supplied locally by radioisotope power tiles, only information may need to be passed between the main vehicle and the extended component. In FIG. 10, this is shown with a vehicle 1000 and a component 1030 having no physical connection, and only passing data, commands, and status information though wireless communication 1020 from component 1030 to enclosure 1010, and vice versa. Component 1030 is powered and heated locally by radioisotope power tiles 1032, and does not need any power or heat from the main bus.

The type of radioisotope that is used may be selected based on its heat generation characteristics and/or half-life for a given mission. For instance, Pu-238 has a half-life of 88 years, which is suitable for long missions (e.g., 15-20 years). However, as demonstrated by the Voyager spacecraft launched in the 1970's, such systems may be capable of powered operation for substantially longer. Shorter-lived isotopes, such as isotopes of strontium, may be used for shorter missions. However, some such isotopes are too hot for conventional designs (e.g., producing heat of around 2000° C.). Shorter-lived radioisotopes tend to generate more heat in their rapid race to decay, and conventional monolithic designs suffer from even larger internal temperatures because of this. The ability to distribute the radioisotopes within the power tile can generate lower local temperatures, enabling thermal compatibility with more materials.

It will be readily understood that the components of various embodiments of the present invention, as generally described and illustrated in the figures herein, may be arranged and designed in a wide variety of different configurations. Thus, the detailed description of the embodiments of the systems, apparatuses, methods, and computer programs of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

It should be noted that reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. A radioisotope power tile, comprising:
a tile body;
one or more radioisotope power units located within the tile body; and
one or more radiator surfaces operably connected to at least one of the one or more radioisotope power units, wherein
the one or more radiator surfaces constitute respective surfaces of the radioisotope power tile.

2. The radioisotope power tile of claim 1, wherein the one or more radioisotope power units comprise $CoSb_3$, $LaFe_4Sb_{12}$, $Fe_3CoSb_{12}$, $CsBi_4Te_6$, $Bi_{0.5}Sb_{1.5}Te_3$, or any combination thereof.

3. The radioisotope power tile of claim 1, wherein the radioisotope power unit is located on a surface of or within a vehicle, on a surface of or within an internal component of the vehicle, or on a surface of or within an internal component of the vehicle.

4. The radioisotope power tile of claim 1, wherein a local temperature provided by the radioisotope power tile is between 20° C. and 100° C.

5. The radioisotope power tile of claim 1, wherein the one or more radioisotope power units comprise:
a radioisotope unit comprising one or more radioisotopes;
one or more hot shoes operably connected to the radioisotope unit;
one or more cold shoes; and
a plurality of thermal junctions operably connecting the one or more hot shoes to the one or more cold shoes.

6. The radioisotope power tile of claim 5, wherein the radioisotope unit is clad in a metal, the metal comprising Pt, Pd, Os, W, or any combination thereof, that captures radiation from the one or more radioisotopes and converts the radiation into heat.

7. The radioisotope power tile of claim 5, wherein the one or more cold shoes are each thermally connected to a radiator surface of the one or more radiator surfaces.

8. The radioisotope power tile of claim 1, wherein the tile body comprises an insulator, an aerogel, multilayer insulation (MLI), or any combination thereof.

9. The radioisotope power tile of claim 1, further comprising:
one or more electronic or mechanical components within the tile body.

10. The radioisotope power tile of claim 9, wherein a component of the one or more components is configured to receive heat from a radioisotope of at least one of the one or more radioisotope power units.

11. The radioisotope power tile of claim 9, wherein
the tile body comprises insulation, and
a component of the one or more components is insulated from heat from a radioisotope of at least one of the one or more radioisotope power units by insulation of the tile body.

12. The radioisotope power tile of claim 1, wherein
the radioisotope power tile is operably connected to a vehicle, and
the radioisotope power tile is configured to supply power and heat to one or more components of the vehicle that are otherwise separated from a main power system of the vehicle.

13. The radioisotope power tile of claim 1, wherein
the radioisotope power tile is operably connected to one or more components of a vehicle that are separated from a main body of the vehicle, and
the radioisotope power tile is configured to supply power and heat to the one or more separated components.

14. A radioisotope power tile, comprising:
one or more radioisotope power units; and
one or more radiator surfaces operably connected to at least one of the one or more radioisotope power units, wherein
the one or more radiator surfaces constitute respective surfaces of the radioisotope power tile.

15. The radioisotope power tile of claim 14, wherein the one or more radioisotope power units comprise $CoSb_3$, $LaFe_4Sb_{12}$, $Fe_3CoSb_{12}$, $CsBi_4Te_6$, $Bi_{0.5}Sb_{1.5}Te_3$, or any combination thereof.

16. The radioisotope power tile of claim 14, wherein the radioisotope power unit is located on a surface of or within a vehicle, on a surface of or within an internal component of the vehicle, or on a surface of or within an internal component of the vehicle.

17. The radioisotope power tile of claim 14, wherein the one or more radioisotope power units comprise:
a radioisotope unit comprising one or more radioisotopes;
one or more hot shoes operably connected to the radioisotope unit;
one or more cold shoes; and
a plurality of thermal junctions operably connecting the one or more hot shoes to the one or more cold shoes.

18. The radioisotope power tile of claim 17, wherein the radioisotope unit is clad in a metal, the metal comprising Pt, Pd, Os, W, or any combination thereof, that captures radiation from the one or more radioisotopes and converts the radiation into heat.

19. The radioisotope power tile of claim 17, wherein the one or more cold shoes are each thermally connected to a radiator surface of the one or more radiator surfaces.

20. The radioisotope power tile of claim 14, further comprising:
a tile body comprising the one or more radioisotope power units and the one or more radiator surfaces.

21. The radioisotope power tile of claim 20, further comprising:
one or more electronic or mechanical components within the tile body.

22. The radioisotope power tile of claim 21, wherein a component of the one or more components is configured to receive heat from a radioisotope of at least one of the one or more radioisotope power units.

23. The radioisotope power tile of claim 21, wherein
the tile body comprises insulation, and
a component of the one or more components is insulated from heat from a radioisotope of at least one of the one or more radioisotope power units by insulation of the tile body.

24. The radioisotope power tile of claim 14, wherein
the radioisotope power tile is operably connected to a vehicle, and
the radioisotope power tile is configured to supply power and heat to one or more components of the vehicle that are otherwise separated from a main power system of the vehicle.

25. The radioisotope power tile of claim 14, wherein
the radioisotope power tile is operably connected to one or more components of a vehicle that are separated from a main body of the vehicle, and
the radioisotope power tile is configured to supply power and heat to the one or more separated components.

26. A radioisotope power tile, comprising:
a tile body;
one or more radioisotope power units located within the tile body; and
one or more radiator surfaces operably connected to at least one of the one or more radioisotope power units, wherein
the one or more radioisotope power units comprise:
a radioisotope unit comprising one or more radioisotopes,
one or more hot shoes operably connected to the radioisotope unit,
one or more cold shoes, and
a plurality of thermal junctions operably connecting the one or more hot shoes to the one or more cold shoes,
the one or more cold shoes are each thermally connected to a radiator surface of the one or more radiator surfaces, and
the one or more radiator surfaces constitute respective surfaces of the radioisotope power tile.

27. The radioisotope power tile of claim 26, wherein the one or more radioisotope power units comprise $CoSb_3$, $LaFe_4Sb_{12}$, $Fe_3CoSb_{12}$, $CsBi_4Te_6$, $Bi_{0.5}Sb_{1.5}Te_3$, or any combination thereof.

28. The radioisotope power tile of claim 26, wherein the radioisotope power unit is located on a surface of or within a vehicle, on a surface of or within an internal component of the vehicle, or on a surface of or within an internal component of the vehicle.

29. The radioisotope power tile of claim 26, wherein the radioisotope unit is clad in a metal, the metal comprising Pt, Pd, Os, W, or any combination thereof, that captures radiation from the one or more radioisotopes and converts the radiation into heat.

30. The radioisotope power tile of claim 26, wherein the tile body comprises an insulator, an aerogel, multilayer insulation (MLI), or any combination thereof.

31. The radioisotope power tile of claim 26, further comprising:
one or more electronic or mechanical components within the tile body.

32. The radioisotope power tile of claim 31, wherein a component of the one or more components is configured to receive heat from a radioisotope of at least one of the one or more radioisotope power units.

33. The radioisotope power tile of claim 31, wherein
the tile body comprises insulation, and
a component of the one or more components is insulated from heat from a radioisotope of at least one of the one or more radioisotope power units by insulation of the tile body.

34. The radioisotope power tile of claim 26, wherein
the radioisotope power tile is operably connected to a vehicle, and
the radioisotope power tile is configured to supply power and heat to one or more components of the vehicle that are otherwise separated from a main power system of the vehicle.

35. The radioisotope power tile of claim 26, wherein
the radioisotope power tile is operably connected to one or more components of a vehicle that are separated from a main body of the vehicle, and
the radioisotope power tile is configured to supply power and heat to the one or more separated components.

* * * * *